(12) United States Patent
Li et al.

(10) Patent No.: US 10,968,103 B1
(45) Date of Patent: Apr. 6, 2021

(54) COPPER-FILLED CARBON NANOTUBES AND SYNTHESIS METHODS THEREOF

(71) Applicants: Wenzhi Li, Palmetto Bay, FL (US); Arun Thapa, Miami, FL (US)

(72) Inventors: Wenzhi Li, Palmetto Bay, FL (US); Arun Thapa, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 16/936,706

(22) Filed: Jul. 23, 2020

(51) Int. Cl.
| | |
|---|---|
| *C01B 32/16* | (2017.01) |
| *C23C 16/26* | (2006.01) |
| *C23C 16/50* | (2006.01) |
| *C23C 16/02* | (2006.01) |
| *B82Y 40/00* | (2011.01) |
| *C01B 32/178* | (2017.01) |
| *B82Y 30/00* | (2011.01) |

(52) U.S. Cl.
CPC .............. *C01B 32/16* (2017.08); *B82Y 30/00* (2013.01); *B82Y 40/00* (2013.01); *C01B 32/178* (2017.08); *C23C 16/0227* (2013.01); *C23C 16/26* (2013.01); *C23C 16/50* (2013.01); *C01B 2202/08* (2013.01); *C01B 2202/10* (2013.01); *C01P 2002/72* (2013.01); *C01P 2002/82* (2013.01); *C01P 2002/85* (2013.01); *C01P 2004/03* (2013.01); *C01P 2004/04* (2013.01)

(58) Field of Classification Search
CPC ... B82Y 40/00; C01B 2202/10; C01B 32/178; C01B 2202/08; C01B 32/16; C01B 32/162; C01B 32/164; C23C 16/26
See application file for complete search history.

(56) References Cited

U.S. PATENT DOCUMENTS

| | | | |
|---|---|---|---|
| 10,336,618 B1 * | 7/2019 | Li | .................. C01B 32/162 |
| 2014/0126112 A1 * | 5/2014 | Nguyen | ............... H01G 11/36 |
| | | | 361/502 |

FOREIGN PATENT DOCUMENTS

| | | | |
|---|---|---|---|
| CN | 104036878 A | * | 9/2014 |
| TW | 444067 A | * | 7/2001 |

OTHER PUBLICATIONS

Machine translation of TW444067A, published Jul. 1, 2001. (Year: 2001).*
Machine translation of CN104036878A, published Sep. 10, 2014. (Year: 2014).*
Zhu, Synthesis of bamboo-like carbon nanotubes on a copper foil by catalytic chemical vapor deposition from ethanol, 2012, Carbon 50, pp. 2504-2512. (Year: 2012).*

(Continued)

*Primary Examiner* — Monique R Jackson
(74) *Attorney, Agent, or Firm* — Saliwanchik, Lloyd & Eisenschenk

(57) ABSTRACT

Copper-filled carbon nanotubes and methods of synthesizing the same are provided. Plasma-enhanced chemical vapor deposition can be used to synthesize vertically aligned carbon nanotubes filled with copper nanowires. The copper filling can occur concurrently with the carbon nanotube growth, and the carbon nanotubes can be completely filled by copper. The filling of Cu inside the CNTs can be controlled by tuning the synthesis temperature.

18 Claims, 7 Drawing Sheets

(56) References Cited

OTHER PUBLICATIONS

Katar, Direct Deposition of Bamboo-Like Carbon Nanotubes on Copper Substrates by Sulfur-Assisted HFCVD, 2008, Hindawi Publishing Corporation, Journal of Nanomaterials, vol. 2008, Article ID 515890, 7 pages. (Year: 2008).*
A. A. Setlur et al., Formation of Filled Carbon Nanotubes and Nanoparticles Using Polycyclic Aromatic Hydrocarbon Molecules, Carbon vol. 36, No. 5-6, pp. 721-723, 1998.
C. Y. Zhang et al., Cu-filled cabon nanotubes by simultaneous plasma-assisted copper incorporation, Appl. Phys. Lett. 82 1926 (2003); https://doi.org/10.1063/1.1562341.
X. K. Tao et al., Thermal CVD synthesis of carbon nanotubes filled with single-crystalline Cu nanoneedles at tips, Diamond and Related Materials, 15 (2006) 1271-1275.
X. Y. Tao et al., Controllable synthesis of novel one-dimensional carbon nanomaterials on an alkali-element-modified Cu catalyst, Nanotechnology 17 (2006) 224-226.
Zhiyu Wang et al., In situ synthesis of super-long Cu nanowires inside carbon nanotubes with coal as carbon source, Carbon 44 (2006 1845-1869.
Bin Deng et al., Synthesis of Copper-Core/Carbon-Sheath Nanocables by a Surfactant-Assisted Hydrothermal Reduction/Carbonization Process, J. Phys. Chem. B 2006, 110, 11711-11716.
X. Y. Tao et al., Synthesis and characterization of Cu filled carbon nanohorns, Materials Chemistry and Physics, 104 (2007) 210-214.
Q. Zhang et al., Synthesis of carbon nanotubes with totally hollow channels and/or with totally copper filled nanowires, Applied Physics A 86, 265-269 (2007).
Jijun Ding et al., One-step synthesis of pure Cu nanowire/carbon nanotube coaxial nanocables with different structures by arc discharge, Journal of Physics and Chemistry of Solids 72 (2011) 1519-1523.
Yuxin Zhao et al., A flexible chemical vapor deposition method to synthesize copper@carbon core-shell structured nanowires and the study of their structural electrical properties, New J. Chem., 2012, 36, 1161-1169.

* cited by examiner

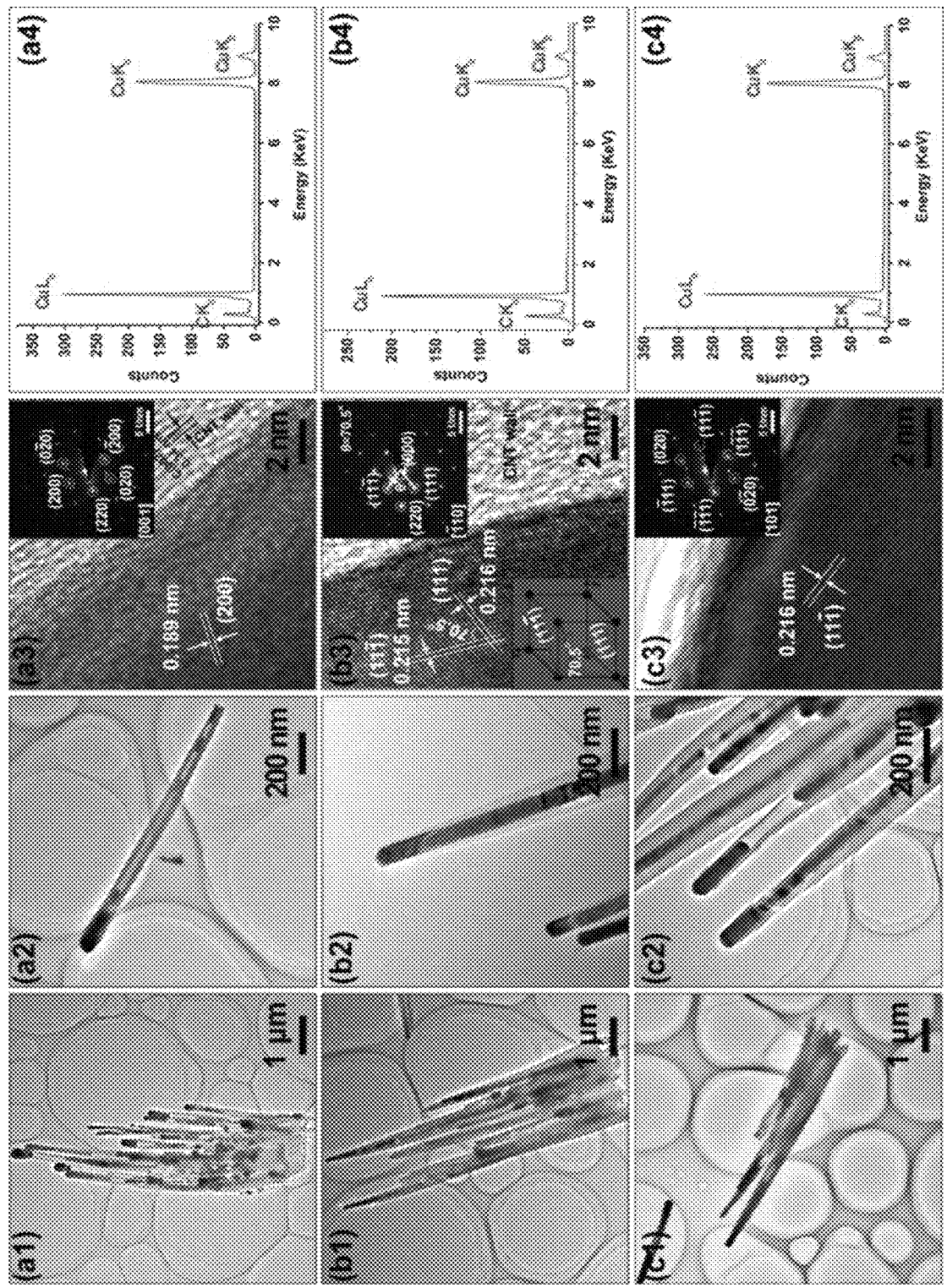
FIGS. 4a1-4c4

US 10,968,103 B1

COPPER-FILLED CARBON NANOTUBES AND SYNTHESIS METHODS THEREOF

GOVERNMENT SUPPORT

This invention was made with government support under DMR1506640 awarded by the National Science Foundation. The government has certain rights in the invention.

BACKGROUND

Metals in their one-dimensional nanostructures such as nanowires, nanorods, and nanoparticles are fundamental for miniaturizing sophisticated mechanical, optical, and electronic devices. Since the report of single-crystal metals encapsulated in carbon nanoparticles in 1993, much attention has been concentrated on the synthesis of metal-carbon hybrid materials, especially metal nanowires encapsulated by carbon. Carbon nanotubes (CNTs) are well known for their high tensile strength and chemical stability. CNT encapsulated nanowires can survive in harsh environments because the carbon shells act as a protective barrier, allowing the material to be preserved in its pure form. The synergistic effect of the core metal nanowires and CNT shells, as well as the well-defined dimension of the nanowires, can open up novel applications or improve the performance of existing devices. CNTs filled with metals have diverse applications in multifunctional nanodevices such as nanomagnets, nanoswitches, nanopipettes, nanowelding, and nanothermometers.

BRIEF SUMMARY

Embodiments of the subject invention provide novel and advantageous filled carbon nanotubes (CNTs) and methods of synthesizing the same. In situ methods (e.g., chemical vapor deposition techniques such as plasma-enhanced chemical vapor deposition (PECVD)) can be used to synthesize CNTs (e.g., vertically aligned CNTs (VACNTs)) filled with copper (Cu). The Cu-filled CNTs can also be thought of CNTs encapsulating Cu nanowires. The Cu nanowire is the core, and the CNT is the shell, so a core-shell structured one-dimensional material is formed. The filled core can be, for example, in crystal form. The Cu filled CNTs can be grown vertically on substrates (e.g., Cu substrates such as Cu foils or Cu plates) using PECVD. The Cu filling can occur concurrently with the CNT growth, and the CNTs can be partially or completely filled by copper depending on the synthesis conditions. The filling of Cu inside the CNTs can be controlled by tuning the synthesis temperature.

In an embodiment, a method of synthesizing Cu-filled CNTs can comprise: providing a Cu substrate in a reaction chamber; heating the reaction chamber to a predetermined growth temperature; providing a carbon precursor gas to the reaction chamber; and performing a PECVD technique for a predetermined amount of time to simultaneously grow CNTs and fill the CNTs with Cu, thereby synthesizing the Cu-filled CNTs on the Cu substrate. The CNTs can have a filling rate (the percentage of all CNTs that are filled with Cu) of at least 70% (e.g., at least 80% or in a range of 80%-90%). The CNTs can be grown vertically on the Cu substrate, such that the Cu-filled CNTs are Cu-filled VACNTs. The CNTs can have an average filling ratio (the proportion of the CNT that is filled to the total CNT) of the Cu of at least 0.99 (e.g., at least 0.999). The carbon precursor gas can be, for example, acetylene, methane, ethylene, or ethanol. The predetermined growth temperature can be in a range of from 650° C. to 750° C. (e.g., from 690° C. to 710° C.). The predetermined amount of time can be in a range of from 15 minutes to 60 minutes (e.g., around 30 minutes). The method can further comprise providing a first gas to the reaction chamber prior to heating the reaction chamber to the predetermined growth temperature, and the first gas can be, for example, ammonia gas or hydrogen gas. The method can further comprise evacuating the reaction chamber (e.g., to a pressure of less than 0.1 Torr) prior to providing the first gas to the reaction chamber, and the providing of the first gas to the reaction chamber can result in a pressure of the reaction chamber increasing (e.g., to at least 5 Torr). The method can further comprise: polishing the Cu substrate prior to providing the Cu substrate in the reaction chamber, the Cu substrate comprising an average surface roughness of less than 10 nanometers (nm) after the polishing; and/or cleaning the Cu substrate prior to providing the Cu substrate in the reaction chamber (and after the polishing, if the polishing is performed), the cleaning of the Cu substrate comprising, for example, ultrasonically cleaning the Cu substrate in at least one solvent bath. The PECVD technique can comprise applying a direct current (DC) plasma to the substrate once the predetermined growth temperature is reached. The method can further comprise allowing the Cu substrate with the Cu-filled CNTs thereon to naturally cool down to room temperature.

In another embodiment, a compound can comprise: a Cu substrate; and a plurality of Cu-filled VACNTs on the Cu substrate. The VACNTs can have a filling rate of at least 70% (e.g., at least 80% or in a range of 80%-90%). The VACNTs can have an average filling ratio of the Cu of at least 0.99 (e.g., at least 0.999).

BRIEF DESCRIPTION OF DRAWINGS

FIG. 4a1 is a transmission electron microscope (TEM) image of CNTs synthesized at 650° C., showing the entire length of the CNTs. The scale bar is 1 μm.

FIG. 4a2 is a TEM image of CNTs synthesized at 650° C., showing the material trapped/filled inside the CNTs. The scale bar is 200 nanometers (nm).

FIG. 4a3 is a TEM image of CNTs synthesized at 650° C., showing the interface between the graphitic layers of CNTs and the filler material. The scale bar is 2 nm. The inset represents the selected area diffraction (SAD) pattern of the material trapped/filled inside the CNT.

FIG. 4a4 is an EDS spectrum from the filler material of the VACNTs synthesized at 650° C.

FIG. 4b1 is a TEM image of CNTs synthesized at 700° C., showing the entire length of the CNTs. The scale bar is 1 μm.

FIG. 4b2 is a TEM image of CNTs synthesized at 700° C., showing the material trapped/filled inside the CNTs. The scale bar is 200 nm.

FIG. 4b3 is a TEM image of CNTs synthesized at 700° C., showing the interface between the graphitic layers of CNTs and the filler material. The scale bar is 2 nm. The inset represents the SAD pattern of the material trapped/filled inside the CNT.

FIG. 4b4 is an EDS spectrum from the filler material of the CNTs synthesized at 700° C.

FIG. 4c1 is a TEM image of CNTs synthesized at 750° C., showing the entire length of the CNTs. The scale bar is 1 μm.

FIG. 4c2 is a TEM image of CNTs synthesized at 750° C., showing the material trapped/filled inside the CNTs. The scale bar is 200 nm.

FIG. 4c3 is a TEM image of CNTs synthesized at 750° C., showing the interface between the graphitic layers of CNTs and the filler material. The scale bar is 2 nm. The inset represents the SAD pattern of the material trapped/filled inside the CNT.

FIG. 4c4 is an EDS spectrum from the filler material of the CNTs synthesized at 750° C.

DETAILED DESCRIPTION

Figure 1:
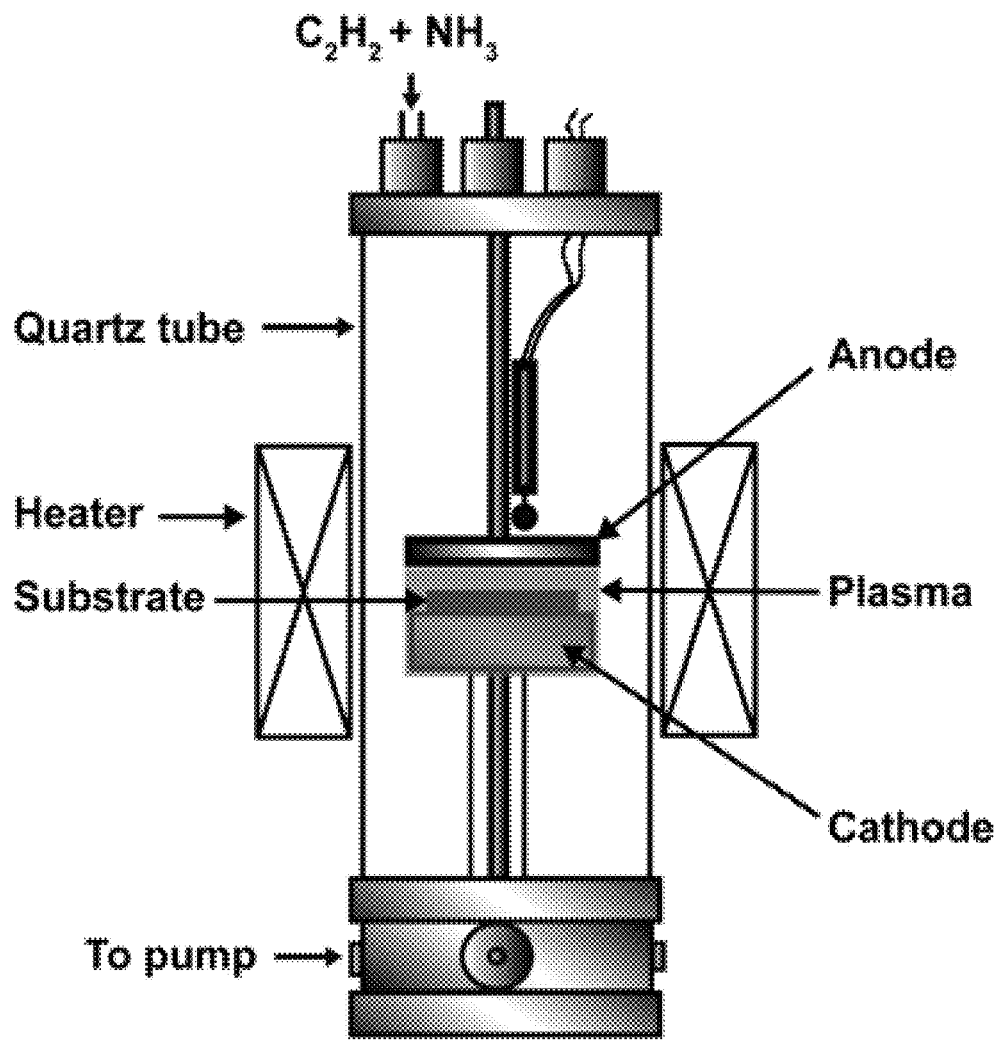
FIG. 1 is a schematic view of a plasma-enhanced chemical vapor deposition (PECVD) system that can be used to synthesize filled vertically aligned carbon nanotubes (VACNTs), according to an embodiment of the subject invention. The VACNTs can be copper (Cu)-filled VACNTs and can be synthesized on Cu disks.

Embodiments of the subject invention provide novel and advantageous filled carbon nanotubes (CNTs) and methods of synthesizing the same. The CNTs can be single-walled or multi-walled. In situ methods (e.g., chemical vapor deposition techniques such as plasma-enhanced chemical vapor deposition (PECVD)) can be used to synthesize CNTs (e.g., vertically aligned CNTs (VACNTs)) filled with copper (Cu). The Cu-filled CNTs can also be thought of as CNTs encapsulating Cu nanowires. The Cu nanowire is the core, and the CNT is the shell, so a core-shell structured one-dimensional material is formed. The filled Cu core can be, for example, in crystal form. The Cu filled CNTs can be grown vertically on substrates (e.g., Cu substrates such as Cu foils or Cu plates) using PECVD. The Cu filling can occur concurrently with the CNT growth, and the CNTs can be partially or completely filled by copper depending on the synthesis conditions. The filling of Cu inside the CNTs can be controlled by tuning the synthesis temperature. Only at appropriate temperatures are the CNTs fully or even adequately filled by the Cu. The Cu filled CNT arrays display exceptional electron emission properties, with great potential applications in electronics and materials. In particular, the CNTs completely filled with Cu show especially superior electron field emission properties. In many embodiments Cu is filled inside VACNTs, and this can be done via, for example, PECVD.

Synthesis methods of embodiments of the subject invention are superior to related art methods for many reasons. For example, related art methods require filling enhancers such as supercritical fluids, which can destroy the CNTs because they are refluxed in concentrated acids containing Cu precursor salts. Also, the related art methods are plagued by many issues including low yield of Cu-filled carbon nanotubes, complex and lengthy procedures, an absolute requirement of polyaromatic hydrocarbon and hydrogen, the requirement of organic/inorganic Cu salts, the lack of preferred orientation of the Cu-filled carbon nanotubes, and powder-based (substrate-free) techniques that require careful post-growth processing of the final product due to the contamination of unnecessary byproducts. Synthesis methods of embodiments of the subject invention can be performed with no filling enhancers and can also avoid the other downfalls of related art methods. For example, synthesis methods of embodiments of the subject invention do not require extra catalyst source, polyaromatic hydrocarbon, or external substrate-treatment such as acid-treatment, or oxidation-reduction treatment to activate the catalyst particles.

Embodiments of the subject invention provide CNTs (e.g., VACNTs) filled with Cu, and the filled CNTs can have an average filling ratio (the proportion of the CNT that is filled to the total CNT) of 0.80 or higher. The average filling ratio can be any of the following values, about any of the following values, at least any of the following values, or greater than any of the following values (all values are unitless): 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, 0.995, 0.999, 0.9999, or 1.0. For example, the filling ratio can be at least 0.999 (e.g., when the synthesis temperature is around 700° C.). The filling rate (the percentage of all CNTs that are filled with Cu) can be at least 70%. The filling rate can be any of the following values, about any of the following values, at least any of the following values, or greater than any of the following values (all values are in %): 70, 71, 72, 73, 74, 75, 76, 77, 78, 79, 80, 81, 82, 83, 84, 85, 86, 87, 88, 89, 90, 91, 92, 93, 94, or 95. For example, the filling rate can be in a range of 80%-90%.

Embodiments of the subject invention enable the filling of CNTs with pure Cu metal at a very high filling rate (e.g., in a range of 80-90%). In addition, embodiments of the subject invention enable the synthesis of vertically aligned (perpendicular to the (Cu) substrate) and mechanically self-supported and pure Cu-filled CNT arrays with a direct connection to the bulk (Cu) substrate. The direct growth of Cu-filled CNT arrays on conducting metallic Cu substrates not only minimizes the contact resistance but also saves the trouble of later integrating the arrays with Cu substrates, which are beneficial to many applications in electronics. Embodiments provide simple and economical methods of fabricating Cu-filled CNT arrays on Cu foil or plates because the Cu filing inside the CNTs is an in situ process.

FIG. 1 is a schematic view of a PECVD system that can be used to synthesize Cu-filled VACNTs, according to an embodiment of the subject invention. Cu-filled CNTs and Cu-filled VACNTs can be denoted as Cu@CNTs and Cu@VACNTs, respectively. Referring to FIG. 1, the PECVD apparatus (e.g., a direct current (DC) PECVD apparatus) can include a chamber (e.g., a tube such as a quartz tube) comprising an anode, a cathode, and plasma. A heater can be provided outside the chamber, and gas and other materials can be provided (e.g., pumped) to the tube during the process. The substrate can be disposed in the plasma, between the anode and the cathode. The substrate can be, for example, a Cu disk, foil, or plate. The substrate can be optionally polished to provide a smooth substrate (e.g., average roughness of less than 10 nanometers (nm)) prior to the deposition. The substrate can also be cleaned (e.g., ultrasonically cleaned in a bath). The substrate (after polishing and/or cleaning, is applicable) can be provided to the reaction chamber, and the chamber can be evacuated to a very low pressure (e.g., less than 0.05 Torr, such as 0.01 Torr). A gas (e.g., ammonia gas or $H_2$ gas) can be introduced to the chamber at a set flow rate, increasing the pressure (e.g., to at least 5 Torr, such as 7 Torr). The synthesis can take place at a set growth temperature (e.g., in a range of 550° C. to 800° C.). The temperature can be increased at a set rate (e.g., 50° C. per minute) until the set growth temperature is reached. A plasma (e.g., a DC plasma of 90 Watts (W)) can be applied to the substrate when the targeted set growth temperature is reached, and then carbon precursor gas (e.g., acetylene, methane, ethylene, or ethanol) can be introduced at a set flow rate. The synthesis can go for a set amount of time (e.g., 15-60 minutes, such as 30 minutes). The substrate can then be allowed to cool (e.g., naturally cool down to room temperature) to give the final product.

In many embodiments, VACNTs are synthesized. VACNTs are advantageous because they can grow directly on the substrate (e.g., Cu substrate), yielding straight, uniform, and parallel CNTs. If not grown vertically, the resulting product is a powder that is hard to handle and non-uniform.

The role of Cu as an active catalytic metal for the synthesis of CNTs is not well-understood in the related art. Cu is considered a poor catalyst owing to its extremely low carbon solubility, 0.0001 wt. % C at 1100° C., which inhibits the formation of building blocks of CNT's wall (i.e., C—C bond). However, C atoms can dissolve into the Cu nanoparticles at temperatures lower than the melting point of bulk Cu. Although Cu particles formed after the heat treatment at different temperatures may be relatively large (see, e.g., FIGS. 2a-2f and Example 1), C atoms can still dissolve into the Cu particles during the CNT synthesis process, and Cu particles can act as a catalyst. It is also important to determine the state of Cu particles to understand the growth mechanism of Cu@VACNTs. The melting point of bulk Cu is 1085° C.; however, the melting point of the Cu nanoparticle may be 100-250° C. lower than that of the bulk Cu. Even after a significant reduction in melting point due to the morphology change, the growth temperatures (650-750° C.) employed in Example 1 were not high enough to melt the Cu particles. However, the Cu particles at the temperature range mentioned above may be in the quasi-liquid state, which implies that the growth mechanism of Cu@VACNTs was primarily through the vapor-quasi-liquid-solid (VLS) mechanism assisted by quasi-liquid capillary adsorption. Based on this, FIG. 6 is a schematic view of a growth mechanism of Cu-filled VACNTs, according to an embodiment of the subject invention.

Figure 6:
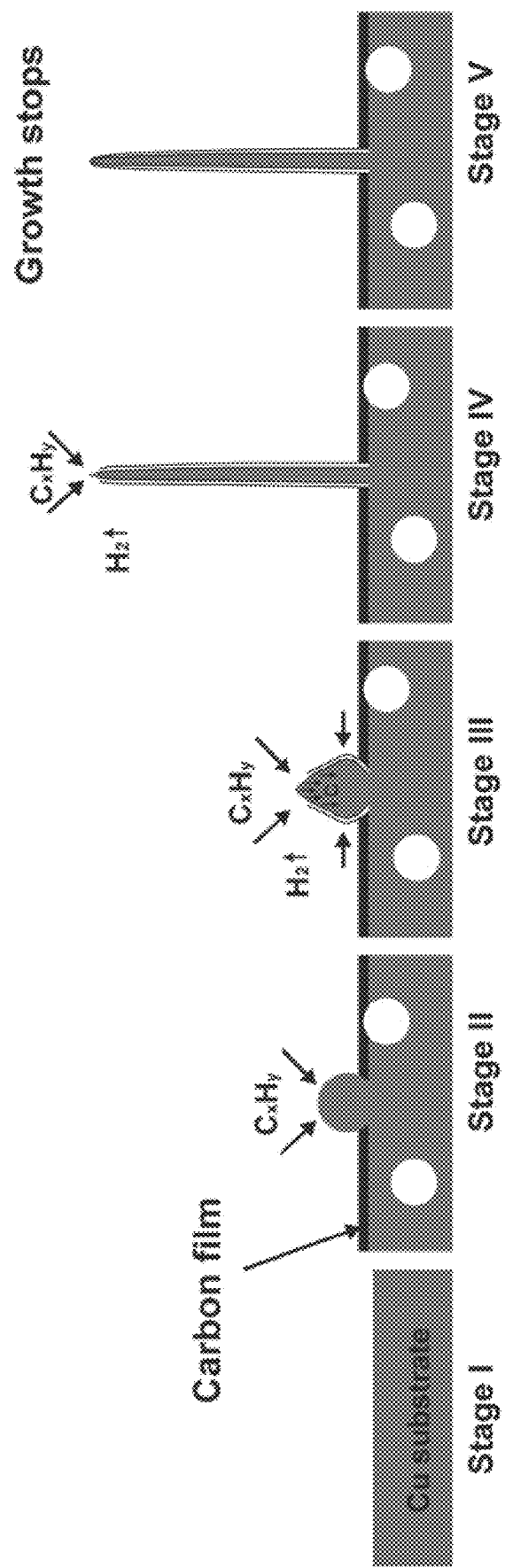
FIG. 6 is a schematic view of a growth mechanism of Cu-filled VACNTs, according to an embodiment of the subject invention.

Referring to FIG. 6, initially, the precursor gas ($C_2H_2$) can thermally decompose into C atoms along with energetic radicals ($C_xH_y$) and hydrogen gas ($H_2$) due to the weak catalytic activity of Cu and can deposit on the surface of the substrate as a thin layer. Simultaneously, an ensemble of individual Cu particles can be formed due to thermally induced surface breakup under the reducing environment. The surface disintegration can transform the substrate into highly porous morphology, as shown in stage II of FIG. 6. The porous morphology can be seen in FIGS. 3b-3c (and Example 2) but with less frequency as compared to FIGS. 2d-2f (and Example 1). This result confirms the presence of a thin layer of C deposition. In the later stage, the decomposition of the $C_2H_2$ into C atoms at the surface of the quasi-liquid Cu particle can lead to the dissolution and precipitation of C atoms forming graphite layers on the grain boundary (stage III, FIG. 6). Extrusion stress between the graphite layers and Cu particle can transform the catalyst particle into a nanocone with the tip exposed for further decomposition of precursor gas and incorporation of C atoms. As a result, the VACNT can grow longer, and simultaneously the semi-molten Cu metal can be sucked into the VACNT due to the capillary action (stage IV, FIG. 6). During this process, the compressive pressure at the core from CNT walls (about 40 gigaPascals (GPa)) can help to elongate the Cu nanowire along the axes of the VACNT. The length of Cu@VACNT depends upon the continuous availability of Cu filler and the catalytic ability of the tip of Cu nanowire. That means the growth of Cu@VACNT terminates as the tip of Cu nanorod inhibits further dissolution and precipitation of C atoms (stage V, FIG. 6).

Referring to Examples 1 and 2 below, a fundamental difference in the growth mechanism of empty VACNTs grown at 650° C. and Cu@VACNTs synthesized at higher temperatures was the state of catalyst Cu particle. The catalyst particles supporting the growth of empty VACNTs may be in the solid state, which did not facilitate the capillary filling during the growth process. Also, the presence of extended Cu nanorod at the tip of some of the VACNTs (FIG. 4$a$1) could be due to the elongation of the catalyst particle under intense compressive pressure from graphitic layers. Such a type of filling can occur when CNTs have the solid catalyst particle at their tip. On the other hand, partially filled VACNTs observed for S750 may be due to the high internal energy of the Cu nanowire at sufficiently high growth temperature causing atomic gliding dislocation.

Copper (Cu) is one of the most commonly used metals in electrical circuits as interconnects owing to its high conductivities of heat and electricity. Moreover, a weak interaction of Cu with carbon (binding energy of 0.1-0.144 electron volts per atom (eV/atom)), along with its higher thermal and electrical conductivities, make CNT encapsulated Cu nanowires an attractive possibility for many potential applications of CNTs filled with metals (e.g., nanomagnets, nanoswitches, nanopipettes, nanowelding, and nanothermometers). In addition, VACNT encapsulated Cu nanowires can also find potential applications in electron field emission devices because a new functionality can be achieved by combining the properties of both core materials and VACNTs.

Related art ex situ methods for filling Cu in CNTs involves the Cu (or any foreign materials) impregnation in the hollow interior of the CNTs after the CNT growth. Methods include supercritical fluid chemical deposition (SFCD) and chemical fluid deposition (CFD) techniques, sonication-assisted wet chemical methods, solution infusion methods, and electrochemical co-deposition methods. These ex situ methods rely heavily on supercritical fluids having properties such as extremely low surface tension, low viscosity, high diffusivity, and high pressure. Also, these multi-step filling methods are relatively complicated and sometimes the nanotubes can be destroyed because CNTs are refluxed in concentrated acids containing precursor salts. Another problem associated with ex situ filling methods is that the filling rate is low.

In contrast, in situ methods of embodiments of the subject invention enable the growth of CNTs and their filling with Cu simultaneously. Such in situ techniques can give large scale production of Cu@CNTs with a well-defined dimension of Cu core and high filling rate. Related art in situ methods have not successfully achieved high filling rate or large scale production with a well-defined dimension of Cu core. Such related art methods include, for example, hydrogen arc methods, microwave plasma-assisted chemical vapor deposition (MPCVD), surfactant-assisted hydrothermal methods, thermal decomposition methods, laser vaporization methods, and chemical vapor deposition (CVD). These related art methods have several problems, including low yield of filled CNTs, complex and lengthy procedures, an absolute requirement of polyaromatic hydrocarbon and hydrogen, the necessity of organic/inorganic Cu source salts, lack of preferred orientation of the nanowires, and powder-based (substrate-less) techniques that require careful post-growth processing of the final product due to the contamination of unnecessary byproducts.

Embodiments of the subject invention provide simple and controlled methods of synthesizing large scale, vertically aligned, and mechanically self-supported pure Cu-filled CNT arrays with a direct connection to the substrate leading to enhanced field emission. The Cu@VACNTs can be grown on catalytic bulk substrates (e.g., Cu substrates such as Cu disks) without the deposition of an extra metal catalyst layer, and this can be done, for example, via a plasma-enhanced chemical vapor deposition (PECVD) method. Field emission measurements show that the turn-on and threshold electric field of the Cu@VACNT emitters can be lowered by more than half compared to hollow VACNT emitters. Also, an increase of more than two-fold in the field enhancement factor for Cu@VACNTs confirms that they are good candidates for field emission applications. Prior to the subject invention, little has been known about the field emission behavior of the Cu@VACNT arrays because of the previous difficulty (prior to embodiments of the subject invention) associated with fabricating Cu@VACNT arrays directly on the substrate.

Prior to the subject invention, it was thought that CNTs cannot be synthesized directly on a bulk Cu substrate without the aid of an additional catalyst due to the limited solubility of C into the Cu. Embodiments of the subject invention surprisingly are able to synthesize Cu-filled VACNTs directly on a Cu substrate without an additional catalyst. A PECVD method can be used where plasma has abundant number of highly energetic species that helps in activating catalyst nanoparticles by etching amorphous carbon from the catalyst surface. Also, the energetic plasma species contribute in the efficient decomposition of hydrocarbon gas that can lead to the graphitization even when the substrate is not heat-treated externally.

Cu is one of the most commonly used metals in electrical circuits as interconnects owing to its high conductivity of heat and electricity. CNTs are mechanically strong and chemically stable, and they have excellent thermal and electrical conductivities. Embodiments of the subject invention provide methods of integrating Cu nanowires with CNTs to form hybrid nanomaterials with new functionalities. The Cu nanowire is protected by inert CNT shells while the crystalline Cu core provides exceptional electrical and thermal conductivities. The Cu-filled CNTs have wide applications in nanodevices such as nanoelectronics, nanoswitches, nanopipettes, nanowelding, and nanothermometers. Cu@VACNT arrays can be synthesized directly on bulk Cu substrates and can find potential applications in electron field emission devices such as flat panel displays and vacuum tube X-ray devices due to the Ohmic contact between the substrate and Cu-filled CNTs, the vertical alignment of Cu-filled CNTs, the highly conductive substrate, and the presence of highly conductive Cu nanowire at the core of the CNTs.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

Materials and Methods

Arrays of Cu@VACNTs were synthesized by DC PECVD. An apparatus as shown in FIG. 1 was used, and a detailed description of the system can be found in Thapa et al. (Direct growth of vertically aligned carbon nanotubes on stainless steel by plasma enhanced chemical vapor deposition, Diamond and Related Materials 90 (2018) 144-153) and U.S. Patent Application Publication No. 2020/0002171-A1, both of which are hereby incorporated herein by reference in their entireties. First, a 0.6-millimeter (mm) thick Cu sheet (99.95 wt %) was cut into circular disks of diameter of about 1.5 centimeters (cm). The Cu disks were polished with sandpaper to a smooth surface having an average roughness of about 6.93 nm and root mean squared (RMS) roughness of about 9.03 nm. The polished disks were ultrasonically cleaned for 10 minutes in acetone and isopropyl alcohol baths, respectively. The clean Cu disks were transferred into the PECVD chamber, and the chamber was evacuated to a base pressure of 0.01 Torr. Then, $NH_3$ gas was introduced into the chamber at a flow rate of 600 sccm, and the pressure inside the chamber was maintained at 7 Torr. The carbon material growth synthesis processes were performed at different temperatures in a range of 550° C. to 800° C. The temperature ramping rate for each experiment was maintained at 50° C./min. A DC plasma of 90 W was applied to the Cu disks when the targeted growth temperature was reached, and then carbon precursor gas $C_2H_2$ was introduced at a flow rate of 25 sccm. Each synthesis was run for 30 minutes, and as-synthesized samples were allowed to cool down naturally to room temperature before being characterized. Some substrates were treated with heat at different temperatures such as 650° C., 700° C., and 750° C. for 10 minutes under the $NH_3$ environment at the pressure of 7 Torr to understand the surface evolution on the substrates just before the application of carbon precursor gas.

Surface topography after the heat treatment of the Cu disks at different temperatures was characterized by a Tapping Mode Atomic Force Microscope (TM-AFM, Veeco Multimode Nanoscope IIID) and a Scanning Electron Microscope (SEM, JEOL JSM-6330F) operated at an accelerating voltage of 25 kilovolts (kV). The surface morphology of the as-synthesized carbon deposits was studied by SEM, JEOL JSM-6330F. Transmission electron microscopy (TEM) images, energy dispersive X-ray (EDS) spectra, and selected area electron diffraction (SAD) patterns were collected by using a Tecnai $G^2$ 20 U-Twin high-resolution transmission electron microscope with an acceleration voltage of 200 kV. The degree of structural defects on the as-synthesized samples was characterized by Raman spectroscopy ($Ar^+$ laser excitation, wavelength 632.8 nm). The crystal structure of the Cu@VACNTs was established via X-ray diffraction (XRD) experiments in Siemens Diffraktometer D5000 using Cu ($K\alpha$) radiation ($\lambda$=1.54 Å) with the step size of 0.02° ranging from 20° to 80° at a speed of 0.5°/min.

Field emission characteristics of the unfilled VACNT arrays and Cu@VACNT arrays were measured using a diode configuration inside a vacuum chamber with a base pressure of about $1\times10^{-6}$ Torr. The as-synthesized samples glued on a stainless-steel plate by silver paste were used as the cathode and a solid cylindrical stainless-steel rod (0.803 $cm^2$) was used as the anode (see also the inset of FIG. 7b). A fixed gap of 500 μm was maintained between the anode and the samples to be tested. Voltage bias was applied in an increasing step of 50 V using a Matsusada AU-15P20 DC power supply. The field emission current was measured with a Keithley 236 source measure unit. For the reproducibility of the results, multiple cycles of the current density vs. applied field (F-J) characteristics were recorded for several samples under each growth condition.

Example 1—Surface Morphology of the Cu Substrate

Surface evolution of the catalytic substrate, including catalyst film decorated substrate, before its interaction with carbon precursor gas at elevated temperatures is fundamental to the successful growth of CNTs based on the vapor-liquid-solid (VLS) growth mechanism. The critical aspect of the surface evolution is the formation of potentially active nucleation sites, such as nanoparticles or nano-hills, as a result of the surface break up due to the complex processes related to the surface energy. The availability of these nanostructures at the surface of the substrate can facilitate the dissociation of the carbon precursor gas and further dissolution and precipitation of the carbon atoms or clusters to synthesize CNTs.

Figures 2A, 2B, 2C, 2D, 2E, 2F:
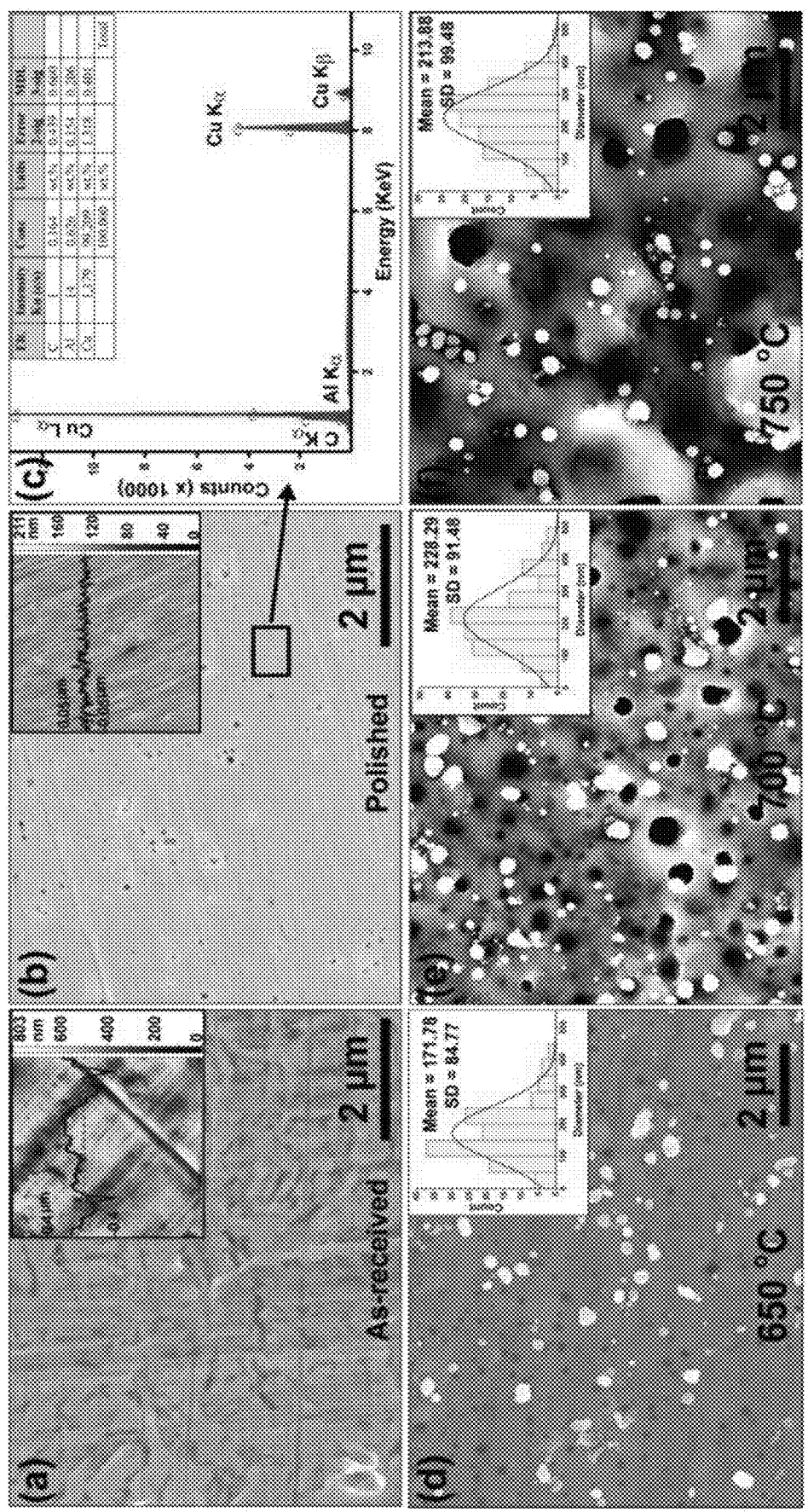
FIG. 2a is a scanning electron microscope (SEM) image showing surface morphology of a Cu substrate before heat treatment (as received). The scale bar is 2 micrometers (μm). The inset is an atomic force microscopy (AFM) image showing the surface profile along the line shown in the corresponding image.
FIG. 2b is an SEM image showing surface morphology of a Cu substrate before heat treatment (polished). The scale bar is 2 μm. The inset is an AFM image showing the surface profile along the line shown in the corresponding image.
FIG. 2c is an energy-dispersive X-ray spectroscopy (EDS) spectrum for the substrate of FIG. 2b.
FIG. 2d is an SEM image showing surface morphology of a Cu substrate after heat treatment at 650° C. White dots are the Cu particles, and black spots are the holes formed on the surface of the Cu substrate. The scale bar is 2 μm. The inset represents the particle distribution of the substrate.
FIG. 2e is an SEM image showing surface morphology of a Cu substrate after heat treatment at 700° C. White dots are the Cu particles, and black spots are the holes formed on the surface of the Cu substrate. The scale bar is 2 μm. The inset represents the particle distribution of the substrate.
FIG. 2f is an SEM image showing surface morphology of a Cu substrate after heat treatment at 750° C. White dots are the Cu particles, and black spots are the holes formed on the surface of the Cu substrate. The scale bar is 2 μm. The inset represents the particle distribution of the substrate.

FIGS. 2a and 2b represent the surface morphology of the as-received and polished Cu substrate, respectively. The insets in FIGS. 2a and 2b are the corresponding AFM images showing the surface profile along the line shown in the respective images. The as-received surface characterized with irregular topography was found to have an average roughness ($R_a$) of 76.56 nm and RMS roughness ($R_q$) of 97.70 nm. Apart from a few scratches present due to polishing, a smooth surface with $R_a$=6.93 nm and $R_q$=9.03 nm was achieved after polishing, as shown in FIG. 2b, which can be helpful in synthesizing VACNT arrays with uniform length. The EDS spectrum, comprised of mainly Cu signals, shows the elemental composition of the polished surface, as shown in FIG. 2c. A trace amount of Al recorded on the EDS spectrum can be assigned to the SEM sample holder. FIGS. 2d, 2e, and 2f depict the SEM images of the surface topography of the substrates after heat treatment at 650° C., 700° C., and 750° C., respectively, in the $NH_3$ environment.

Referring to FIGS. 2d-2f, it can be seen that heating significantly changed the surface morphology of the substrate. The surfaces after the heat treatment contained an ensemble of nanoparticles (white dots in FIGS. 2d-2f) along with many holes (black spots in FIGS. 2d-2f). The reason for producing such nanoparticles on the substrates' surface could be the surface structural rearrangement in atomic and nanoscale induced by the heat under the reducing atmosphere. The effect of heating on the surface modification was intensified as the temperature was raised, causing a gradual increase in the size of holes and particles, as shown in FIGS. 2d-2f. However, the particles for 700° C. and 750° C. cases were roughly similar in size. More precisely, the diameter of the nanoparticles was found to be 171.78±84.77 nm, 228.29±91.48 nm, and 213.88±99.48 nm for samples after the heat treatment at 650° C., 700° C., and 750° C., respectively. Extensive features with a grain size of more than 1 μm were not considered for the statistical analysis of the particle distribution because only the nanoparticles are of pronounced interest regarding their role in the growth of CNTs. These results suggest that different temperatures have a different effect on surface evolution as the smaller nanoparticles were observed at low-temperature treatment (650° C.) compared to the treatment at higher temperatures (700° C. and 750° C.). This non-uniformity in particle size could lead to the variation in morphology (e.g., diameter) of the VACNTs synthesized at different growth temperatures.

Example 2—Synthesis and Characterization of VACNTs on Cu Disks

Figures 3A, 3B, 3C, 3D, 3E, 3F:
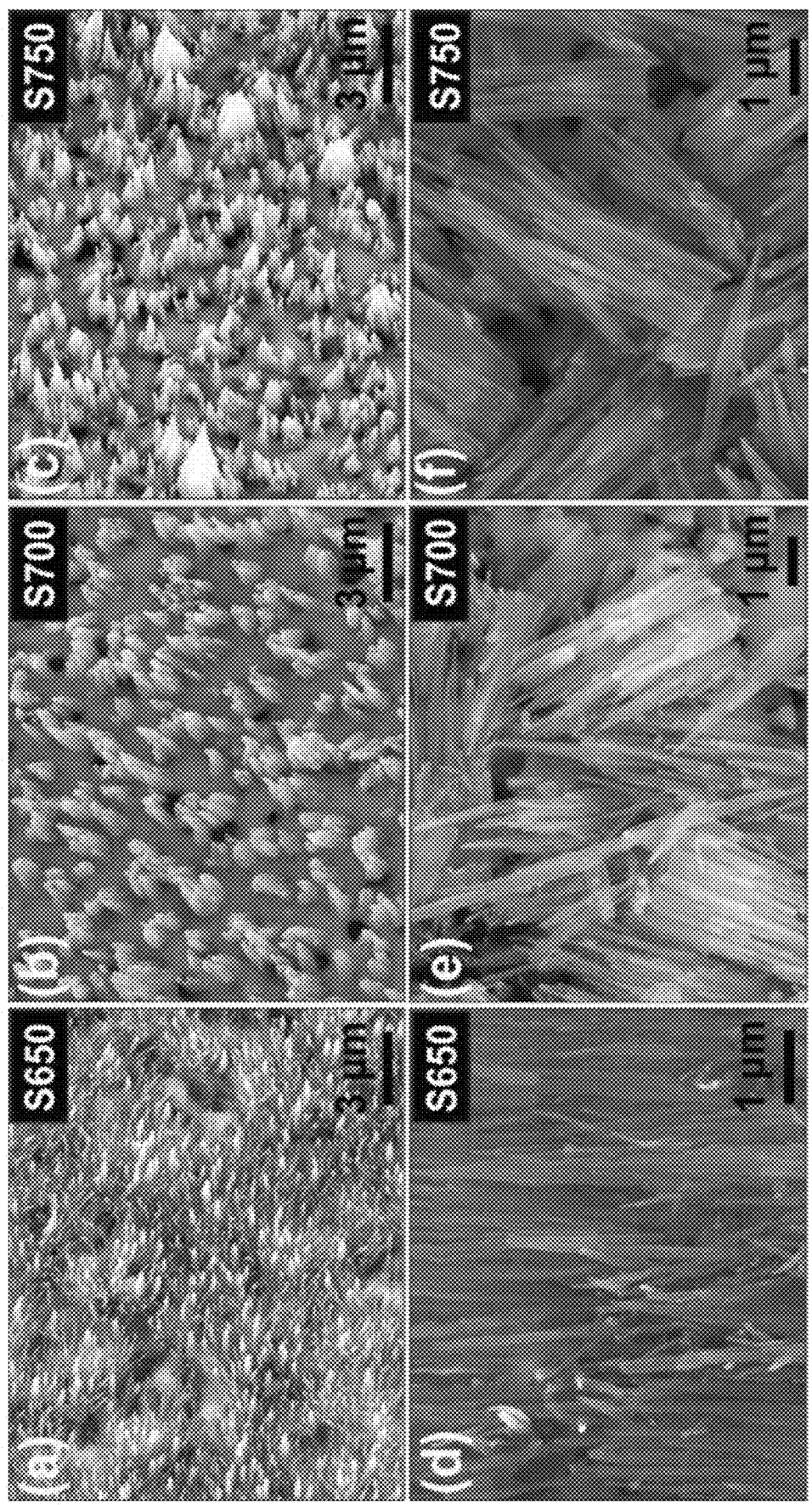
FIG. 3a is an SEM image of VACNTs synthesized on a Cu substrate at a temperature of 650° C. for 30 minutes. The other growth parameters included flow rates of $C_2H_2$ and $NH_3$ at 25 sccm and 600 sccm, respectively, a pressure of 7 Torr, and a plasma power of 90 W. The scale bar is 3 μm.
FIG. 3b is an SEM image of VACNTs synthesized on a Cu substrate at a temperature of 700° C. for 30 minutes. The other growth parameters included flow rates of $C_2H_2$ and $NH_3$ at 25 sccm and 600 sccm, respectively, a pressure of 7 Torr, and a plasma power of 90 W. The scale bar is 3 μm.
FIG. 3c is an SEM image of VACNTs synthesized on a Cu substrate at a temperature of 750° C. for 30 minutes. The other growth parameters included flow rates of $C_2H_2$ and $NH_3$ at 25 sccm and 600 sccm, respectively, a pressure of 7 Torr, and a plasma power of 90 W. The scale bar is 3 μm.
FIG. 3d is an SEM image of a close-up view of the VACNTs of FIG. 3a, showing the length of the CNTs. The scale bar is 1 μm.
FIG. 3e is an SEM image of a close-up view of the VACNTs of FIG. 3b, showing the length of the CNTs. The scale bar is 1 μm.
FIG. 3f is an SEM image of a close-up view of the VACNTs of FIG. 3c, showing the length of the CNTs. The scale bar is 1 μm.

PECVD synthesis was performed at various temperatures in the range of 550° C. to 800° C. to identify a range of growth temperatures for the successful synthesis of VACNTs on the bulk Cu substrates without an extra catalyst layer. The other growth parameters (growth time of 30 min, plasma power of 90 W, pressure of 7 Torr, a flow rate of $NH_3$ and $C_2H_2$ at 600 sccm and 25 sccm, respectively) were kept constant throughout the experiments, which were optimized through a series of experiments to achieve high yield without compromising the sample quality. The VACNTs grown at 550° C. and 650° C. were similar in terms of morphology and hence only the results for the VACNTs fabricated at 650° C. will be discussed herein. In addition, the sample synthesized at 800° C. did not produce VACNTs; rather, a thick layer of amorphous carbon was deposited on the substrate. FIGS. 3a, 3b, and 3c represent the typical SEM images (20° tilt-view) of the VACNTs synthesized directly on the Cu disks at 650° C., 700° C., and 750° C., respectively. These samples can be referred to herein as S650, S700, and S750, respectively. FIGS. 3d-3f show the scratched area of corresponding samples showing the entire length of the CNTs.

The SEM images revealed that the morphology of VACNT arrays was significantly affected by the different growth temperatures. Arrays of individual self-standing VACNTs were observed for the lower growth temperatures such as 650° C. (FIG. 3a); however, the higher growth temperatures such as 700° C. or 750° C. produced bundles of VACNTs, as shown in FIGS. 3b and 3c. The reason behind the two different morphologies of VACNT arrays observed in samples S650 and S700 or S750 can be described as follows. At lower growth temperature (S650), individual catalyst particles, possibly in solid state, catalyzed the growth of VACNTs, which resulted in an array of self-standing VACNTs. However, few adjacent tiny particles were coalesced to form a bigger catalyst particle due to the Ostwald ripening at sufficiently higher temperatures (S700 or S750) that may create multiple growth sites to form bundles of VACNTs. Also, the surface of the substrates was covered with a thin layer of amorphous carbon after the growth process. This was apparent from the presence of only a few pores on the surface of samples S700 and S750 (FIGS. 3b and 3c), which otherwise would turn into highly porous surface at higher growth temperatures (see also FIGS. 2d-2f). The diameter of the VACNTs was smaller for S650 as compared to that for S700 and S750. However, the length and number density of the VACNTs for all three samples were observed to be in a narrow range, as presented in Table 1.

The nanostructure of the as-synthesized materials was investigated by using low and high-resolution TEM (HR-TEM) images, as shown in FIGS. 4a1-4c4. TEM observations on S650, as shown in FIGS. 4a1-4a2, revealed the tubular structure of the as-synthesized CNTs with catalyst particles anchored at their tips. Also, the tip particles in some CNTs were stretched down along the CNT axis to form short nanorods. A few CNTs were also found to have discrete nanorods inside them. In other cases, the particles were mainly restricted at the tip of CNTs, as in the case of typical hollow CNTs. The HRTEM observation at the interface between the tip particle and the CNT wall, as shown in FIG. 4a3, shows a clear multilayer of lattice planes separated by a distance of 0.189 nm corresponding to the (200) lattice plane of face-centered cubic (fcc) crystal of Cu. Besides, graphitic layers with an interlayer spacing of about 0.34 nm corresponding to the graphitic (002) plane were present on the wall of CNTs. The selected area diffraction (SAD) pattern observed from the tip particle, as shown in the inset of FIG. 4a3, shows distinct bright spots that can be indexed as (200), (220), and (020) planes of single crystalline fcc Cu along the [001] zone axis. The EDS spectrum, as shown in FIG. 4a4, further confirmed the identity of the tip particle as the pure single crystalline Cu metal, where the C signal can be accredited to the CNT shell.

TEM examination of the sample S700, as seen in FIGS. 4b1-4b2, showed that almost all of the CNTs were filled with foreign material from their root to the tip, forming a complete core-shell structure. The HRTEM image, as seen in FIG. 4b3, shows two different lattice planes (11$\bar{1}$) and (111) corresponding to the fcc crystal of Cu, making an angle of about 70.5° to each other. The bottom left inset in FIG. 4b3 represents the schematic of the possible scenario of intersecting two different planes of the {111} family of the fcc Cu crystal. The top right inset in FIG. 4b3 shows the SAD pattern, which can be indexed as (11$\bar{1}$), (220), and (111) related to the fcc Cu crystal. The presence of Cu, along with C, in the SAD spectrum, as shown in FIG. 4b4, further confirmed the core material as the single crystalline fcc Cu. The Cu@VACNTs were tapered at the tip, where the Cu core was encapsulated with a few layers of graphitic walls. In contrast, a large number of graphitic layers were present near the bottom of Cu@VACNTs. Also, the graphitic layers were not parallel to the growth axis of the Cu core. Hence, it can be concluded that the CNT walls near the tip of the Cu core were formed at the last stage of the growth process. This implies that the tip of the Cu nanowire should be the catalytically active site for the decomposition of precursor, dissolution, and precipitation of carbon atoms or clusters to form CNT shells.

TABLE 1

Variation in catalyst particle size, diameter, length, and number density of VACNTs synthesized at different temperatures.

| Sample | Catalyst particle size (nm) | VACNTs diameter (nm) | VACNTs length (pm) | VACNTs density (per cm$^2$) |
|---|---|---|---|---|
| S650 | 171.78 ± 84.77 | 187 ± 46 | 4.13 ± 1.53 | 8.92 × 10$^8$ |
| S700 | 228.29 ± 91.48 | 246 ± 60 | 4.91 ± 1.07 | 7.28 × 10$^8$ |
| S750 | 213.88 ± 99.48 | 234 ± 68 | 4.76 ± 1.31 | 7.76 × 10$^8$ |

Further increase in the growth temperature (S750) led to the formation of a few partially filled CNTs in which Cu nanowires were characterized by the voids, deformations and dislocations forming a neck-like structure, as shown in FIGS. 4c1-4c2, although most of the CNTs were filled entirely with Cu nanowires. The formation of voids, deformations, and dislocations along the Cu wires can be ascribed to the high temperatures. High internal energy, resulted from the high temperature, increases atomic activity of Cu atoms in the Cu nanowires. The Cu nanowires stretch due to pre-melting occurred at the nanowire edge and on the surface. The pre-melting phenomena significantly decreases the bonding strength of the Cu atoms, leading to atomic gliding dislocations and grain boundary movement. This structural transitioning process creates voids, deformations, and imperfections. Moreover, the HRTEM, SAD pattern, and EDS spectrum, as shown in FIG. 4c3-4c4, indicated the core inside the VACNTs to be a single crystal fcc Cu.

Figures 5A, 5B:
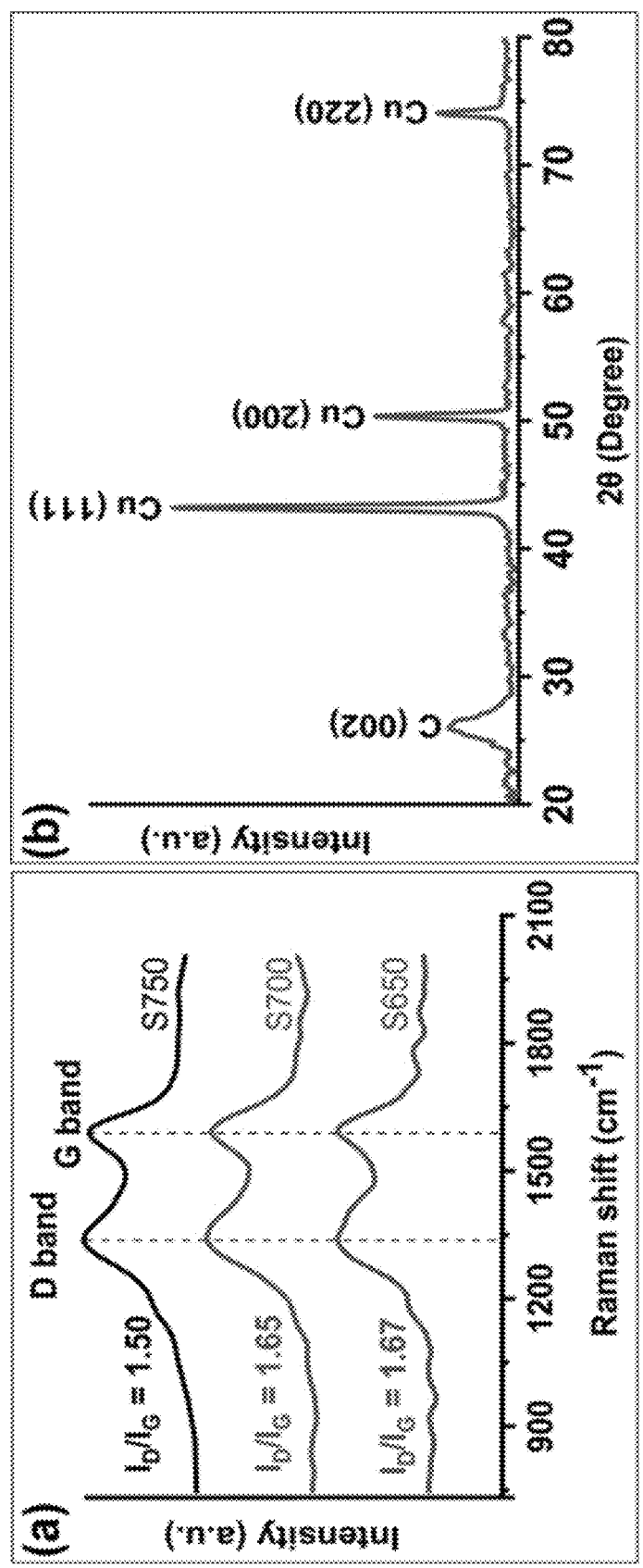
FIG. 5a shows Raman spectra of multi-walled Cu-filled VACNTs synthesized at different temperatures on a Cu substrate. The uppermost curve is for synthesis at 750° C.; the middle curve is for synthesis at 700° C.; and the lowermost curve is for synthesis at 650° C.
FIG. 5b is an X-ray diffraction (XRD) profile of the Cu-filled VACNTs synthesized at 700° C. (S700).

FIG. 5a shows the Raman spectra of VACNTs synthesized at different temperatures corresponding to the SEM images in FIGS. 3a-3f. Two broad peaks at about 1339 cm$^{-1}$ and 1590 cm$^{-1}$ were observed for all the samples. The former peak corresponds to D-band, which is a defect-induced feature originating from out-of-plane vibrations in breathing mode, while the later peak corresponds to G-band which arises due to in-plane vibrations ($E_{2g}$ mode) of the sp$^2$-hybridized carbon network. The integral intensities of these bands expressed as a ratio, $I_D/I_G$, signifies the quality of the carbon materials. A slight decrease in values of $I_D/I_G$ was observed as the growth temperature increased from 650° C. to 750° C. This result implies that the samples grown at higher temperatures were less defective; however, the general high value of $I_D/I_G$ indicates many imperfections in the crystal structure of VACNTs, possibly due to an intense plasma etching on the VACNTs wall during the PECVD synthesis and the amorphous nature of VACNTs wall.

FIG. 5b represents the XRD pattern of the Cu@VACNTs synthesized at 700° C. The XRD profile revealed the diffraction peaks matching the graphite and pure Cu metal. The prominent peaks (20) at 43.18°, 50.34°, and 74.06° can be indexed as (111), (200), and (220) planes of the fcc Cu phase (ICDD PDF No. 04-004-8452) having space group symmetry of Fm-3m. There were no characteristic peaks of impurities of metal oxides. A broad peak at about 26° can be attributed to the (002) plane of the graphitic wall of CNTs. The broadening of the peak could be an indication of the amorphous nature of CNT's wall.

Example 3—Field Emission Properties of Hollow and Cu-Filled VACNTs

Figures 7A, 7B, 7C, 7D:
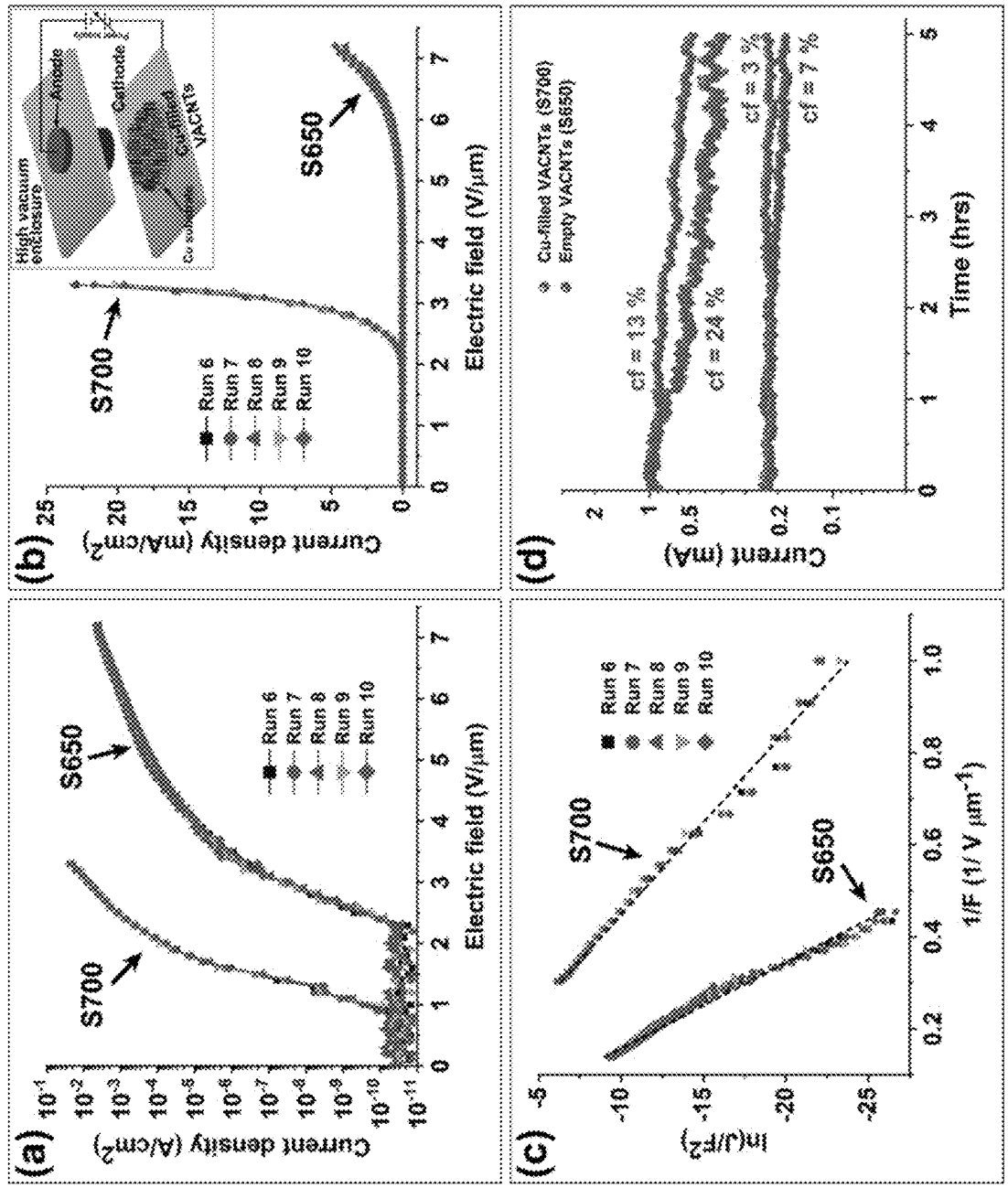
FIG. 7a is a plot of current density (in Amps per square centimeter ($A/cm^2$)) versus electric field (in Volts per micrometer (V/μm)), showing field emission (FE) properties in a semi-log scale for unfilled VACNTs synthesized at 650° C. (S650) and Cu-filled VACNTs synthesized at 700° C. (S700).
FIG. 7b is a plot of current density (in milliAmps per square centimetre ($mA/cm^2$)) versus electric field (in V/μm), showing FE properties in a linear scale for unfilled VACNTs synthesized at 650° C. (S650) and Cu-filled VACNTs synthesized at 700° C. (S700).
FIG. 7c is a Fowler-Nordheim plot of $\ln(J/F^2)$ versus $1/F$ (in $1/V\mu m^{-1}$), showing FE properties for unfilled VACNTs synthesized at 650° C. (S650) and Cu-filled VACNTs synthesized at 700° C. (S700).
FIG. 7d is a plot of current (in milliAmps (mA)) versus time (in hours (hrs)), showing FE properties for unfilled VACNTs synthesized at 650° C. (S650) and Cu-filled VACNTs synthesized at 700° C. (S700). The curve that has current fluctuation (cf)=13% for time=4 hrs at a test current of 1 mA is for Cu-filled VACNTs; the curve that has cf=24% for time=4 hrs at a test current of 1 mA is for empty VACNTs; the curve that has cf=3% for time=4 hrs at a test current of 0.2 mA is for Cu-filled VACNTs; and the curve that has cf=7% for time=4 hrs at a test current of 0.2 mA is for empty VACNTs.

The field emission (FE) properties of the hollow (S650) and Cu-filled (S700) VACNTs synthesized directly on bulk Cu substrates were measured by using a diode configuration method under a pressure of about 10$^{-6}$ Torr. The inset in FIG. 7b shows the schematic of the experimental setup used for measuring the FE properties of the as-synthesized samples, and the results are presented in FIGS. 7a-7d and Table 2. The samples were subjected to the electrical conditioning during the first five runs of current density versus applied field (F-J) cycles to evaporate the residual adsorbates, which otherwise could onset the FE much quicker than their uncontaminated counterparts. Hence, F-J cycles after the 5$^{th}$ run were considered for analyzing the FE properties of the as-synthesized samples.

FIGS. 7a and 7b depict the comparison of F-J properties of unfilled VACNTs and Cu@VACNTs represented on a semi-log and linear scale, respectively. A turn-on electric field ($E_{To}$) and a threshold electric field ($E_{Th}$) were defined as an applied electric field required to produce an emission current density of 10 µA/cm$^2$ and 1 mA/cm$^2$, respectively. The F-J plots revealed that the onset of the FE process from the Cu@VACNTs initiated at a much lower applied electric field and produced a higher total current density ($J_{Total}$) than the unfilled VACNTs. In particular, the $E_{To}$ and $E_{Th}$ values for the Cu@VACNTs were measured as 1.77 V/µm and 2.43 V/µm, respectively. Also, a high $J_{Total}$ in the range of about 19 and 23 mA/cm$^2$ at a field of about 3.3 V/µm was recorded for this sample, which is about fivefold higher than that for the unfilled counterpart. Further, the turn-on electric field observed for Cu@VACNTs was significantly lower than known values for pure Cu nanostructures, amorphous carbon decorated Cu-nanowire, and entangled CNT arrays. Table 3 summarizes key parameters of FE for various field emitters compared with Cu@VACNTs of embodiments of the subject invention. In Table 3, the data for the first row (nanowire) is from Kim et al. (Copper Nanowires with a Five☐Twinned Structure Grown by Chemical Vapor Deposition, Advanced Materials 20(10) (2008) 1859-1863); the data for the second row (nanowire) is from Maurer et al. (Field emission of copper nanowires grown in polymer ion-track membranes, Nuclear Instruments and Methods in Physics Research Section B: Beam Interactions with Materials and Atoms 245(1) (2006) 337-341); the data for the third row (nanowire) is from Chang et al. (Growth of Pagoda-Topped Tetragonal Copper Nanopillar Arrays, ACS applied materials & interfaces 1(7) (2009) 1375-1378); the data for the fourth row (nanobat) is from Wang et al. (Synthesis and growth mechanism of pentagonal Cu nanobats with field emission characteristics, Nanotechnology 17(3) (2006) 719); the data for the fifth row (nanowire) is from Duan et al. (Vertically-aligned single-crystal nanocone arrays: Controlled fabrication and enhanced field emission, ACS applied materials & interfaces 8(1) (2016) 472-479); the data for the sixth row (nanowire) is from He et al. (Novel C/Cu sheath/core nanostructures synthesized via low-temperature MOCVD, Nanotechnology 22(40) (2011) 405704); and the data for the seventh and bottom row is for Cu@VACNTs of embodiments of the subject invention.

Fowler-Nordheim (F-N) theory can be used to approximate the FE properties of the VACNTs and their composite materials (see also Bonard et al. (Carbon nanotube films as electron field emitters, Carbon 40(10) (2002) 1715-1728) and Parveen et al. (Fowler Nordheim theory of carbon nanotube based field emitters, Physica B: Condensed Matter 505 (2017) 1-8); both of which are hereby incorporated by reference herein in their entireties). The field enhancement factors (β) for the unfilled and Cu-filled VACNTs were calculated by using the F-N equation:

$$J = \left(\frac{A\beta^2 F^2}{\phi}\right)\exp\left(-\frac{B\phi^{\frac{3}{2}}}{\beta F}\right) \quad \#(1)$$

where J is the emission current density, A=1.56×10$^{-6}$ A/V$^2$ eV, B=6.83×10$^9$ eV$^{3/2}$ V/m, φ is the work function of the electron field emitter, and F is the applied electric field. Assuming the work function of the VACNTs to be 5 eV in the measurement, the field enhancement factors were calculated by using the slope of the F-N plots, as shown in FIG. 7c. The beta value for the Cu@VACNTs was found to be more than two times bigger than that for the unfilled VACNTs, as shown in Table 2, which is consistent with the observed low values of $E_{To}$, $E_{Th}$, and high value of $J_{Total}$ for the Cu@VACNTs. Also, the observed value of $\beta$=3061 for Cu@VACNTs was higher than known values for Cu-nanowires, Ni-nanowires, Fe-nanowires, and randomly and vertically oriented CNTs. The FE stability of the as-synthesized samples were verified at low (0.24 mA) and high (1 mA) initial currents for 5 hours, as shown in FIG. 7d. For each current versus time graph, the current fluctuation (cf) over the average current ($\bar{I}$) was calculated by using the following equation:

$$cf = \frac{|I - \bar{I}|}{\bar{I}} \times 100\% \qquad \#(2)$$

where I is the value of maximum deviated emission current from the average current value. As depicted in FIG. 7d, the Cu@VACNTs displayed excellent FE stability with the cf values of 3% ($\bar{I}$=0.22±0.01 mA) at initial test current of 0.24 mA and 13% ($\bar{I}$=0.79±0.11 mA) at test current of 1 mA. On the other hand, the cf values for unfilled VACNTs were 7% ($\bar{I}$=0.21±0.02 mA) and 24% ($\bar{I}$=0.62±0.18 mA) at the initial test currents of 0.24 mA and 1 mA, respectively. The enhanced FE stability could be associated with the onset of FE at lower applied field and high field enhancement for Cu@VACNTs, which facilitated to achieve the targeted test currents at much lower applied field compared to unfilled VACNTs. The emitters subjected to the lower field were less vulnerable to the structural degradation due to Joules' heating, thereby producing stable emission current for an extended period of time.

TABLE 2

Field emission properties (Turn-on, threshold electric field, field enhancement factor, and stability) of the unfilled (S650) and Cu-filled (S700) VACNTs.

| Sample | Turn-on field, $E_{To}$ (V/μm) | Threshold field, $E_{Th}$ (V/μm) | Field enhancement Factor, $\beta$ | Current stability cf at 0.24 mA | Current stability cf at 1 mA |
|---|---|---|---|---|---|
| S650 | 3.96 | 6.10 | 1425 | 7% | 24% |
| S700 | 1.77 | 2.43 | 3061 | 3% | 13% |

The low values of $E_{To}$ and $E_{Th}$, the high value of field enhancement factor, and improved emission stability show that Cu@VACNTs are more promising field emitters than the metal nanowires and empty VACNTs for FE applications. The reason for enhanced performance from Cu@VACNTs was the overall increase in electrical and thermal conductivity of the field emitters due to the filling of VACNTs by highly conductive Cu nanowire. The FE process involves electron transportation from the substrate through the interface between the substrate and emitters, along with the emitters, and final emission out into the vacuum. Hence, the electrical conductivity of the field emitter and substrate becomes critical in the context of the FE from VACNTs grown on the substrate. Also, the high thermal conductivity of the field emitter, as well as the substrate, becomes essential for the adequate dissipation of the heat developed due to Joule heating during the FE process, which can protect the emitters against the field evaporation. Apart from the conductivities of VACNT emitters and substrate, contact between them plays an important role in their FE characteristics. High contact resistance can cause resistive heating, which in turn would result in sublimation or melting of VACNTs at the higher electric field, thereby producing subdued FE properties. Contact resistance can be maintained minimally by synthesizing VACNTs directly on the conductive substrate and using a substrate with a work function comparable to that of the emitters. In this regard, the samples tested satisfied both conditions because Cu@VACNTs were directly grown on Cu disks without the aid of additional catalyst and the work function of the Cu (4.6-4.9 eV) is comparable to that of CNTs (5.0 eV). Therefore, high contact resistance issues should not emerge. Hence, the superior FE performance can be accredited to the synergistic effect of possible Ohmic contact between the substrate and Cu@VACNTs, highly conductive substrate, and presence of highly conductive nanowire at the core of VACNT emitters.

TABLE 3

Comparison of key parameters of FE for various field emitters reported in literature and this work.

| Field emitters | Alignment | Turn-on field @ 10 μA/cm² (V/μm) | Field enhancement factor ($\beta$) | Emitter height (μm) | References |
|---|---|---|---|---|---|
| Cu-nanowire | Partially | 4.6 | 443 | ~10.5 | [31] |
| Cu-nanowire | Vertically | 4.3 | 800 | 8-18 | [29] |
| Cu-nanowire | Partially | 12.4 | 713 | ~7 | [58] |
| Cu-nanobat | Partially | 4.0 at 1 μA/cm² | 3900 | 1.5 | [59] |

TABLE 3-continued

Comparison of key parameters of FE for various field emitters reported in literature and this work.

| Field emitters | Alignment | Turn-on field @ 10 μA/cm² (V/μm) | Field enhancement factor ($\beta$) | Emitter height (μm) | References |
|---|---|---|---|---|---|
| Cu-nanowire | Vertically | 7.0 | 1041 | 2 | [28] |
| aC/Cu-nanowire | Vertically | 8.7 | 3210 | ~5 | [60] |
| Cu@VACNT | Vertically | 1.8 | 3061 | 4.9 | This work |

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A method of synthesizing copper (Cu)-filled carbon nanotubes (CNTs), the method comprising:
providing a Cu substrate in a reaction chamber;
heating the reaction chamber to a predetermined growth temperature;
providing a carbon precursor gas to the reaction chamber;
forming a carbon layer on the Cu substrate; and
performing a plasma-enhanced chemical vapor deposition (PECVD) technique for a predetermined amount of time to simultaneously grow CNTs directly on the Cu substrate and fill the CNTs with Cu, thereby synthesizing the Cu-filled CNTs on the Cu substrate, the Cu filling the CNTs and extending from tips thereof during the PECVD technique, and the Cu substrate becoming porous during the PECVD technique,
the CNTs having a filling rate of at least 70%, and
the Cu substrate being a Cu disk, a Cu foil, or a Cu plate.

2. The method according to claim 1, the CNTs being grown vertically on the Cu substrate, such that the Cu-filled CNTs are Cu-filled vertically-aligned CNTs (VACNTs).

3. The method according to claim 1, the CNTs having an average filling ratio of the Cu of at least 0.99.

4. The method according to claim 1, the carbon precursor gas being acetylene, methane, ethylene, or ethanol.

5. The method according to claim 1, the predetermined growth temperature being in a range of from 650° C. to 750° C.

6. The method according to claim 1, the predetermined growth temperature being in a range of from 690° C. to 710° C.

7. The method according to claim 1, the predetermined amount of time being in a range of from 15 minutes to 60 minutes.

8. The method according to claim 1, further comprising providing a first gas to the reaction chamber prior to heating the reaction chamber to the predetermined growth temperature,
the first gas being ammonia gas or hydrogen gas.

9. The method according to claim 8, further comprising evacuating the reaction chamber to a pressure of less than 0.1 Torr prior to providing the first gas to the reaction chamber,
the providing of the first gas to the reaction chamber resulting in a pressure of the reaction chamber increasing to at least 5 Torr.

10. The method according to claim 1, further comprising polishing the Cu substrate prior to providing the Cu substrate in the reaction chamber,
the Cu substrate comprising an average surface roughness of less than 10 nanometers (nm) after the polishing.

11. The method according to claim 1, further comprising cleaning the Cu substrate prior to providing the Cu substrate in the reaction chamber,
the cleaning of the Cu substrate comprising ultrasonically cleaning the Cu substrate in at least one solvent bath.

12. The method according to claim 1, the plasma-enhanced chemical vapor deposition technique comprising applying a direct current (DC) plasma to the substrate once the predetermined growth temperature is reached.

13. The method according to claim 1, further comprising allowing the Cu substrate with the Cu-filled CNTs thereon to naturally cool down to room temperature.

14. The method according to claim 1, further comprising evacuating the reaction chamber to a pressure of less than 0.1 Torr prior to heating the reaction chamber to a predetermined growth temperature.

15. The method according to claim 1, the CNTs having a filling rate of at least 80%.

16. The method according to claim 1, the method being performed without addition of any catalyst.

17. A method of synthesizing copper (Cu)-filled carbon nanotubes (CNTs), the method comprising:
polishing a Cu substrate to provide a polished Cu substrate having an average surface roughness of less than 10 nanometers (nm);
ultrasonically cleaning the polished Cu substrate in at least one solvent bath to provide a cleaned Cu substrate;
providing the cleaned Cu substrate in a reaction chamber;
evacuating the reaction chamber to a pressure of less than 0.1 Torr;
providing a first gas to the reaction chamber, the providing of the first gas to the reaction chamber resulting in a pressure of the reaction chamber increasing to at least 5 Torr;
heating the reaction chamber to a predetermined growth temperature;
providing a carbon precursor gas to the reaction chamber;
forming a carbon layer on the Cu substrate;
performing a plasma-enhanced chemical vapor deposition (PECVD) technique for a predetermined amount of time to simultaneously grow CNTs directly on the Cu substrate and fill the CNTs with Cu, thereby synthesizing the Cu-filled CNTs on the Cu substrate, the Cu filling the CNTs and extending front tips thereof during the PECVD technique, and the Cu substrate becoming porous during the PECVD technique; and
allowing the Cu substrate with the Cu-filled CNTs thereon to naturally cool down to room temperature,
the CNTs having a filling rate of at least 80%,
the CNTs being grown vertically on the Cu substrate, such that the Cu-filled CNTs are Cu-filled vertically-aligned CNTs (VACNTs),
the CNTs having an average filling ratio of the Cu of at least 0.999,
the first gas being ammonia gas or hydrogen gas,
the carbon precursor gas being acetylene, methane, ethylene, or ethanol,
the predetermined growth temperature being in a range of from 690° C. to 710° C.,
the predetermined amount of time being in a range of from 15 minutes to 60 minutes,
the plasma-enhanced chemical vapor deposition technique comprising applying a direct current (DC) plasma to the substrate once the predetermined growth temperature is reached, and
the Cu substrate being a Cu disk, a Cu foil, or a Cu plate.

18. The method according to claim 17, the method being performed without addition of any catalyst.

* * * * *